US012320842B2

(12) United States Patent
Nakamura et al.

(10) Patent No.: US 12,320,842 B2
(45) Date of Patent: Jun. 3, 2025

(54) INSPECTION DEVICE FOR A SEMICONDUCTOR DEVICE

(71) Applicant: HAMAMATSU PHOTONICS K.K., Hamamatsu (JP)

(72) Inventors: Tomonori Nakamura, Hamamatsu (JP); Akihito Uchikado, Hamamatsu (JP); Mitsunori Nishizawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 18/020,273

(22) PCT Filed: Jun. 25, 2021

(86) PCT No.: PCT/JP2021/024153
§ 371 (c)(1),
(2) Date: Feb. 8, 2023

(87) PCT Pub. No.: WO2022/064798
PCT Pub. Date: Mar. 31, 2022

(65) Prior Publication Data
US 2024/0012047 A1    Jan. 11, 2024

(30) Foreign Application Priority Data
Sep. 23, 2020  (JP) ................. 2020-158395

(51) Int. Cl.
*G01R 31/311*   (2006.01)
*G01R 31/317*   (2006.01)

(52) U.S. Cl.
CPC ...... *G01R 31/311* (2013.01); *G01R 31/31709* (2013.01)

(58) Field of Classification Search
CPC .. G01R 31/311; G01R 31/31709; H01L 22/12
See application file for complete search history.

(56) References Cited

U.S. PATENT DOCUMENTS

2007/0002329 A1    1/2007  Kasapi et al.
2015/0153408 A1*   6/2015  Otaka ............... G01R 31/311
                                                    324/754.23

(Continued)

FOREIGN PATENT DOCUMENTS

CN    107615603 A    1/2018
JP    S57-150209 A   9/1982

(Continued)

OTHER PUBLICATIONS

O'Mahony M Jed-Prati G, "Progress in Optical Amplifiers", Proceedings of the Tirrenia International Workshop on Digital Communications, Sep. 19, 1989, p. 73-p. 84, XP000163992.

(Continued)

*Primary Examiner* — Jay Patidar
(74) *Attorney, Agent, or Firm* — Faegre Drinker Biddle & Reath LLP

(57) ABSTRACT

An inspection apparatus includes a light source that emits light, an optical amplifier that amplifies input light and outputs the amplified light, an optical system (an objective lens, an imaging optical system, and a scanning optical system) that irradiates a semiconductor device with the light from the light source and guides light from the semiconductor device to the optical amplifier, and a photodetector that detects the light output from the optical amplifier, and the optical amplifier amplifies the input light so that saturation does not occur.

7 Claims, 3 Drawing Sheets

(56) References Cited

U.S. PATENT DOCUMENTS

2015/0309115 A1  10/2015  Nakamura et al.
2017/0019170 A1   1/2017  Lee

FOREIGN PATENT DOCUMENTS

| | | |
|---|---|---|
| JP | S60-088441 A | 5/1985 |
| JP | H6-109584 A | 4/1994 |
| JP | H6-160035 A | 6/1994 |
| JP | H0778462 B2 * | 8/1995 |
| JP | H8-323663 A | 12/1996 |
| JP | 2000-244417 A | 9/2000 |
| JP | 2007-064975 A | 3/2007 |
| JP | 2011-022148 A | 2/2011 |
| JP | 2012-038805 A | 2/2012 |
| JP | 2015-105851 A | 6/2015 |
| KR | 20180013937 A | 2/2018 |
| KR | 20190011826 A | 2/2019 |
| TW | 201825922 A | 7/2018 |
| WO | WO-2011/004536 A1 | 1/2011 |

OTHER PUBLICATIONS

International Preliminary Report on Patentability mailed Apr. 6, 2023 for PCT/JP2021/024153.

\* cited by examiner

INSPECTION DEVICE FOR A SEMICONDUCTOR DEVICE

TECHNICAL FIELD

One aspect of the present invention relates to an inspection apparatus.

BACKGROUND ART

An inspection apparatus that performs failure analysis of a driven semiconductor device by irradiating the semiconductor device with a laser beam and detecting intensity modulation of reflected light is known (see Patent Literature 1, for example).

CITATION LIST

Patent Literature

[Patent Literature 1] Japanese Unexamined Patent Application No. 2007-64975

SUMMARY OF INVENTION

Technical Problem

In recent years, there has been a demand for an inspection apparatus capable of detecting a phenomenon in a wide band including a higher frequency band as the performance of semiconductor devices has improved. Specifically, for example, there is a demand for an inspection apparatus capable of accurately detecting minute jitter (for example, jitter of about 10 ps) in a transistor that performs switching at a speed below 10 ps.

One aspect of the present invention has been made in view of the above circumstances, and an object thereof is to provide an inspection apparatus capable of accurately detecting a phenomenon in a wide band.

Solution to Problem

An inspection apparatus according to an aspect of the present invention includes a light source configured to emit light; an optical amplifier configured to amplify input light and output the amplified light; an optical system configured to irradiate a semiconductor device with the light from the light source and guide light from the semiconductor device to the optical amplifier; and a photodetector configured to detect the light output from the optical amplifier, wherein the optical amplifier amplifies the input light so that saturation does not occur.

In the inspection apparatus according to the aspect of the present invention, the light from the semiconductor device is input to the optical amplifier, the light is amplified in a range in which saturation does not occur and output in the optical amplifier, and the light output from the optical amplifier is detected in the photodetector. Normally, a light amount of light with which the semiconductor device is irradiated is reduced to such an extent that the semiconductor device is not destroyed. Accordingly, a light amount of returned light from the semiconductor device is also reduced, but there is concern that the detection accuracy will be degraded due to an influence of noise (thermal noise) in a detection system when the light amount of returned light is small. For this reason, a photodetector having a multiplication layer that amplifies returned light is used as a photodetector in the related art. However, the photodetector having the multiplication layer has a relatively large capacity and is not suitable for measurement of a high speed signal (detection of a phenomenon in a high frequency band). In this regard, in the inspection apparatus according to the aspect of the present invention, since the optical amplifier is provided separately from the photodetector and the light amplified by the optical amplifier is detected by the photodetector as described above, amplification of a signal for ensuring detection accuracy can be performed by the optical amplifier, and detection of the light after amplification can be performed by the photodetector. In such a configuration, since a photodetector having a relatively small capacity that does not have a multiplication layer can be used as the photodetector, it is possible to detect a phenomenon in a high frequency band. Further, in the inspection apparatus according to the aspect of the present invention, the light is amplified by the optical amplifier within a range in which saturation does not occur. When saturation occurs, there is concern that the minute signal included in the input light will disappear after the amplification, and the minute signal will not be appropriately detected. In this regard, it is possible to accurately detect even a minute phenomenon on the basis of the output light including the minute signal by amplifying the light in a range in which saturation does not occur. As described above, with the inspection apparatus according to the aspect of the present invention, it is possible to accurately detect a phenomenon in a wide band including a high frequency band.

The optical amplifier may amplify the input light so that a change in a light amount of light to be output with respect to a light amount of input light is linear. Thus, it is possible to accurately detect a phenomenon related to the returned light from the semiconductor device because the input light and the output light are in a linear relationship.

The optical amplifier may amplify the input light so that the light amount of light to be output is larger than half the maximum amount of light that can be output. Thus, it is possible to sufficiently increase a gain while avoiding saturation, and to ensure the detection accuracy of the phenomenon.

The optical amplifier may amplify the input light so that shot noise included in the light to be output exceeds thermal noise of the photodetector. Thus, since the light is amplified so that noise included in the light is greater than the noise related to the photodetector, the noise included in the light (shot noise or relative intensity noise) becomes dominant, and the detection accuracy can be prevented from deteriorating due to an influence of the noise (thermal noise) related to the photodetector.

The optical amplifier may include an amplification element having a length that satisfies a condition for amplifying the input light so that saturation does not occur. This makes it possible to appropriately amplify the input light under a condition set so that saturation does not occur.

The optical amplifier may be a semiconductor amplifier, an optical fiber optical amplifier, or a tapered amplifier. This makes it possible to appropriately amplify the light in the above-described range in which saturation does not occur.

The photodetector may be a PIN photodiode. Thus, it is possible to detect the phenomenon in the high frequency band by using the PIN photodiode having a relatively small capacity as the photodetector.

The photodetector may be configured to be able to detect light in a band of 8 GHz or more. This makes it possible to detect a phenomenon in a high frequency band.

According to the aspect of the present invention, it is possible to provide an inspection apparatus capable of accurately detecting a phenomenon in a wide band.

DESCRIPTION OF EMBODIMENTS

Hereinafter, embodiments of the present invention will be described in detail with reference to the drawings. In each figure, the same or corresponding portions are denoted by the same reference signs, and repeated description is omitted.

First Embodiment

Figure 1:
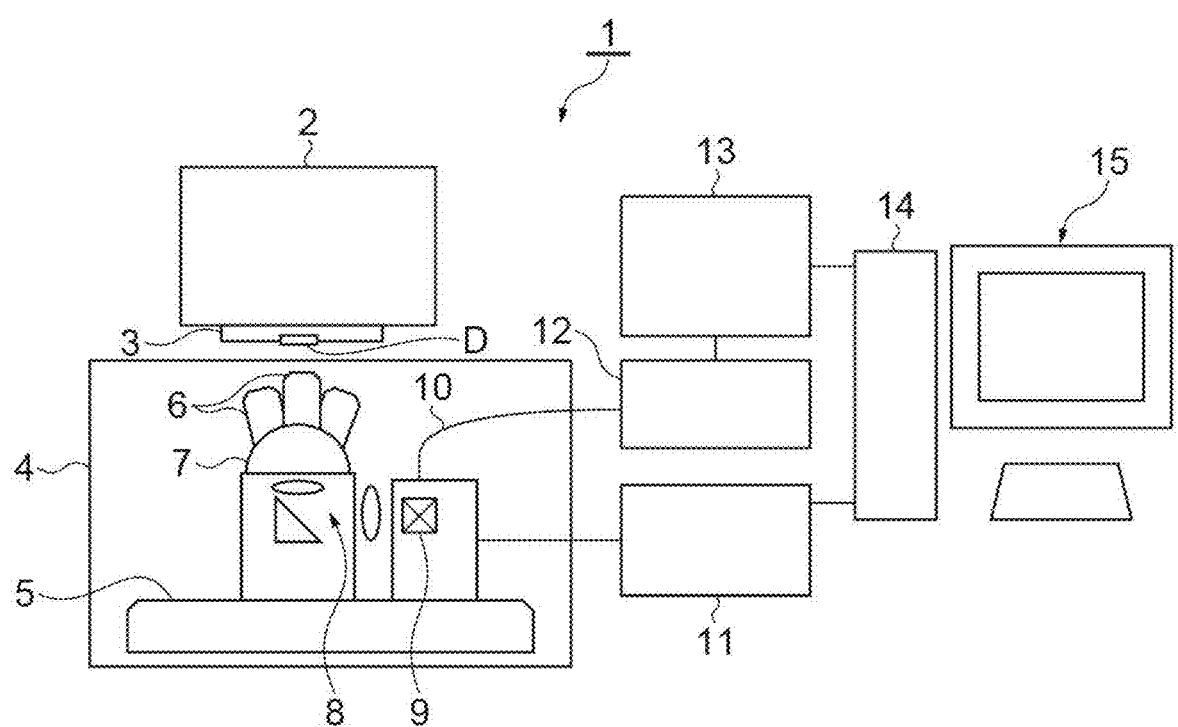
FIG. 1 is a configuration diagram of an inspection apparatus according to an embodiment of the present invention.

As illustrated in FIG. 1, an inspection apparatus 1 according to a first embodiment is an apparatus for inspecting a semiconductor device D that is a measurement target object and is a device under test (DUT), such as specifying an abnormality occurrence location in the semiconductor device D. More specifically, the inspection apparatus 1 specifies a failure location using an optical probing technique called EOP or EOFM. The semiconductor device D may be an integrated circuit (IC) having a PN junction such as a transistor, a logic device, a memory device, an analog device, or a mixed signal device that is a combination thereof, which is a large scale integration (LSI), or a power semiconductor device (power device) such as a large current/high voltage MOS transistor, a bipolar transistor, or an IGBT.

The inspection apparatus 1 includes a tester head 2, a test board 3, a stage 5, an objective lens 6, a turret 7, an imaging optical system 8, a scanning optical system 9, a scanning unit 11, an optical measurement unit 12, a digitizing unit 13, a control apparatus 14, and an input and output apparatus 15. The stage 5, the objective lens 6, the turret 7, the imaging optical system 8, and the scanning optical system 9 are accommodated in a dark box 4. The stage 5 is a platform that holds respective configurations accommodated in the dark box 4.

The tester head 2 has the semiconductor device D mounted via the test board 3, and repeatedly applies a predetermined operation pulse signal to the semiconductor device D. The semiconductor device D is driven by such a test signal. The tester head 2 includes, for example, a pulse generator that generates the operating pulse signal for driving the semiconductor device D, a tester unit that inputs the operating pulse signal to the semiconductor device D, and a power supply. The test board 3 is a semiconductor board on which the semiconductor device D is mounted. The test board 3 includes peripheral chips, circuits, terminals, and the like necessary for an operation of the semiconductor device D.

The scanning optical system 9 receives light emitted from a light source 121 (see FIG. 2) of the optical measurement unit 12 via an optical fiber 10 and guides the light to the imaging optical system 8. Specifically, the light from the light source 121 passes through an optical coupler 122 (see FIG. 2) and is guided to the scanning optical system 9 by the optical fiber 10. A fiber end of the optical fiber 10 may be of an APC type, for example, to reduce reflected light. The scanning optical system 9 includes, for example, an optical scanner including an optical scanning element such as a galvano mirror or a micro electromechanical system (MEMS) mirror. The scanning optical system 9 irradiates (scans) a selected area on the semiconductor device D with light emitted from the light source 121 of the optical measurement unit 12. The selected area is a spot or area selected by a user. The scanning unit 11 controls the scanning optical system 9 on the basis of control of the control apparatus 14 so that the spot of the selected area is irradiated with light.

The imaging optical system 8 receives the light emitted from the light source 121 of the optical measurement unit 12 via the scanning optical system 9 and guides the light to the objective lens 6. The objective lens 6 is a lens that condenses the light from the light source 121 of the optical measurement unit 12 onto the semiconductor device D. The objective lens 6 is configured to be switchable between a low-magnification objective lens (for example, 5×) and a high-magnification objective lens (for example, 50×) by the turret 7. Reflected light (returned light) from the semiconductor device D is input to the optical measurement unit 12 via the objective lens 6, the imaging optical system 8, the scanning optical system 9, and the optical fiber 10. Thus, the objective lens 6, the imaging optical system 8, and the scanning optical system 9 form an optical system that irradiates the semiconductor device D with the light from the light source 121 of the optical measurement unit 12, and guides reflected light (returned light) from the semiconductor device D to an optical amplifier 123 (see FIG. 2) of the optical measurement unit 12.

Figure 2:
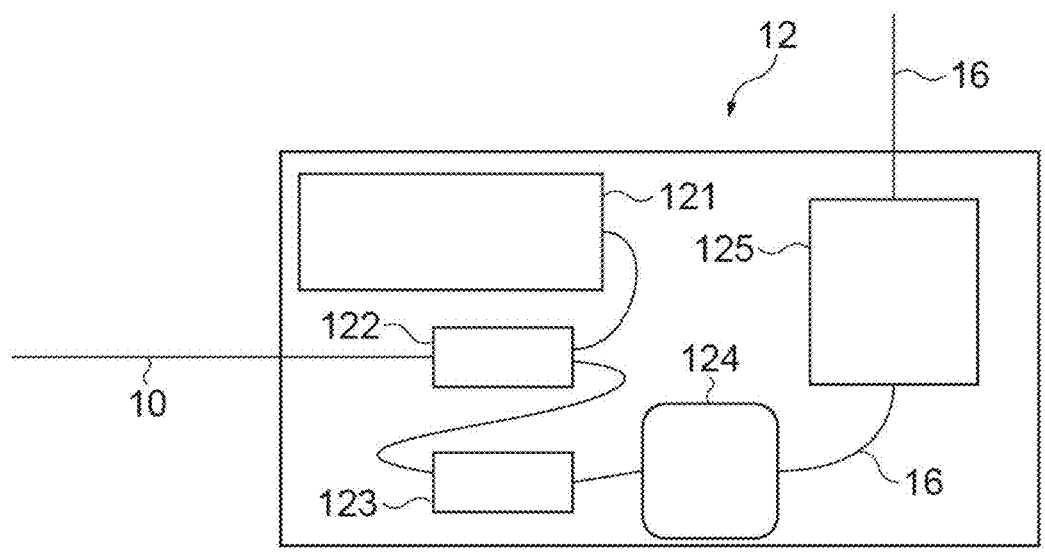
FIG. 2 is a configuration diagram of an optical measurement unit included in the inspection apparatus of FIG. 1.

As illustrated in FIG. 2, the optical measurement unit 12 includes the light source 121, the optical coupler 122, the optical amplifier 123, a photodetector 124, and a high frequency amplifier 125.

The light source 121 is operated by a power supply (not illustrated) to generate and output the light with which the semiconductor device D is irradiated. The light may be coherent light or may be incoherent light. As the light source 121, for example, a super luminescent diode (SLD), an amplified spontaneous emission (ASE) light source, a light emitting diode (LED), or the like can be used. The light output from the light source 121 is guided to the scanning optical system 9 via the optical coupler 122 and the optical fiber 10. The optical coupler 122 is a polarizing beam splitter (PBS) type optical coupler or a circulator type optical coupler. When the optical coupler 122 is the PBS type optical coupler, a λ/4 wavelength plate may be provided inside the scanning optical system 9. Further, when the optical coupler 122 is the circulator type optical coupler, a λ/2 wavelength plate may be provided inside the scanning optical system 9. Further, an optical splitter may be used instead of the optical coupler 122. Further, a Faraday rotator may be provided inside the scanning optical system 9 instead of the wavelength plate described above.

The optical amplifier 123 receives reflected light (returned light) from the semiconductor device D via the optical fiber 10 and the optical coupler 122, amplifies intensity of the reflected light (input light), and outputs amplified light. The optical amplifier 123 is, for example, a semiconductor amplifier, an optical fiber amplifier, a solid optical amplifier (SOA), a taper amplifier (a taper type amplifier), or a booster optical amplifier. Further, the optical amplifier 123 may be an amplifier using a crystal, a gas, liquid, or the like as a laser medium. Output light output from the optical amplifier 123 is input to the photodetector 124 via the optical fiber 10.

Figure 3:
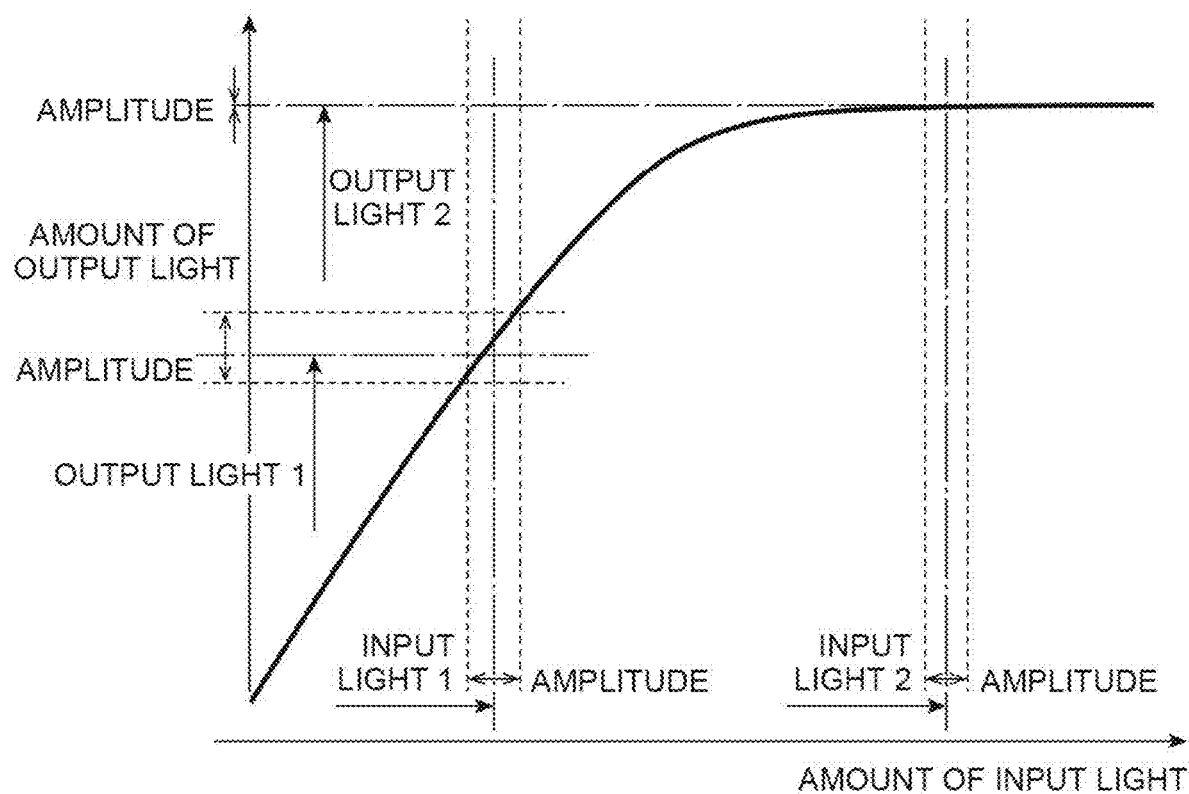
FIG. 3 is a diagram illustrating input and output characteristics of an optical amplifier.

FIG. 3 is a diagram illustrating input and output characteristics of the optical amplifier 123. In FIG. 3, a horizontal axis indicates an amount of light input to the optical amplifier 123, and a vertical axis indicates an amount of light output from the optical amplifier 123. A gain of the optical amplifier 123 has a specific value determined for each wavelength according to characteristics of an element (optical amplifier). An upper limit of intensity of the light that can be output from the optical amplifier 123 is also determined. Therefore, when the intensity of input light to be input is larger than a certain value, optical amplification of the optical amplifier 123 is suppressed, and the optical amplifier 123 cannot amplify the light according to the determined gain. In this case, even when the intensity of the light input to the optical amplifier 123 increases, the intensity of the amplified light remains constant, and an optical amplification characteristic of the optical amplifier 123 becomes nonlinear. Such a state in which the optical amplification characteristic of the optical amplifier 123 is nonlinear is a state in which the optical amplifier 123 is in gain saturation. The fact that the optical amplifier 123 is in the gain saturation at a certain wavelength means that electric charge that can contribute to the amplification of the light at the certain wavelength are all used up and optical amplification is suppressed.

Input light 1 in FIG. 3 is light with intensity at which the optical amplifier 123 is not saturated. Input light 2 in FIG. 3 is light with intensity at which the optical amplifier 123 is saturated. When the input light 1 is input to the optical amplifier 123, the optical amplification characteristic of the optical amplifier 123 becomes linear, and the input light 1 is linearly amplified. In this case, as illustrated in FIG. 3, a minute signal (a portion indicated by a range of an "amplitude" in FIG. 3) included in the input light 1 is also linearly amplified. Since output light in this case includes ASE light (spontaneous emission light), noise increases slightly. On the other hand, when the input light 2 is input to the optical amplifier 123, the optical amplifier 123 is brought to the gain saturation and thus, the optical amplification characteristic of the optical amplifier 123 becomes nonlinear, and the input light 2 is output at an output limit of the optical amplifier 123. In this case, as illustrated in FIG. 3, a minute signal (minute fluctuation) included in the input light 2 is compressed and disappears.

A gain of an optical amplifier depends on a density of excited electrons and a length of the optical amplifier. Since electrons in a ground state absorb light, the density of the excited electrons described above is specifically obtained by subtracting the density of the electrons in the ground state from a density of electrons in an excited state. As the length of the optical amplifier increases, the number of collisions between the electrons in the excited state and photons increases, and the gain increases.

When the optical amplifier is saturated, a density of the electrons in the excited state near an output of the optical amplifier becomes lower than the density of electrons in the ground state as the electrons in the excited state are used for amplification. A maximum output of light to be amplified depends on the density of the excited electrons, depends on the intensity of excitation light in the case of an optical fiber amplifier, and depends on the intensity of a current (excitation current) to be supplied in the case of an SOA. In the optical amplifier, it is possible to increase the density of the excited electrons and increase the gain by increasing such excitation light or excitation current.

Here, when the excitation light or excitation current for the optical amplifier is increased, the density of the excited electrons and the maximum output also increase. That is, when the density of the excited electrons is changed and the gain is changed by changing the excitation light or the like, the maximum output also changes at the same time. Therefore, it is not possible to appropriately switch between a saturated state and a non-saturated state of the light only by changing the excitation light or the like. Therefore, an amplification element having an appropriate gain with respect to input light, that is, an amplification element having an appropriate amplification length may be used in order not to saturate output light. It is possible to achieve a configuration in which the output light is not saturated by attenuating the input light, but since an S/N deteriorates, the amplification length of the amplification element may be appropriately designed as described above.

As described above, when the input light is amplified so that the output light is not saturated, minute noise is superimposed on the output light after the amplification. This is called a noise floor and is about 5 to 10 dB, for example, depending on an amplification method. The gain of the optical amplifier 123 is at least higher than this.

The optical amplifier 123 amplifies the input reflected light so that the output light is not saturated. That is, the optical amplifier 123 amplifies the reflected light within a range in which saturation does not occur in the optical amplifier 123 and the photodetector is not saturated. The optical amplifier 123 amplifies the input light so that change in amount of light to be output with respect to the amount of input reflected light becomes linear. For example, the optical amplifier 123 may amplify the input light so that the amount of light to be output is larger than half the maximum amount of light that can be output. Further, for example, the optical amplifier 123 may amplify the input light so that shot noise included in the light to be output exceeds thermal noise of the photodetector 124. The optical amplifier 123 includes an amplification element having a length that satisfies a condition for amplifying the input light so that saturation does not occur as described above.

The photodetector 124 is an optical sensor that detects the light output from the optical amplifier 123. The photodetector 124 is an optical sensor that detects a high speed optical signal, and is, for example, an optical sensor configured to be able to detect light in a band of 8 GHz or more. The photodetector 124 is, for example, a PIN photodiode. When an optical sensor (for example, a PIN photodiode) capable of detecting a high speed optical signal is used, an input is made with a single-mode fiber and thus, the optical fiber 10 for incidence, the optical coupler 122, and the like may be all configured of a combination of single-mode fibers, but may be configured of an optical system in which a half mirror, a polarizing beam splitter, and a collimator are combined. The photodetector 124 may be, for example, an avalanche photodiode, a photomultiplier tube, or an area image sensor configured to be able to detect a wideband signal of 8 GHz or more. The photodetector 124 outputs a detection signal (an electrical signal). The detection signal output by the photodetector 124 is input to the high frequency amplifier 125 via a high frequency cable 16. The high frequency amplifier 125 amplifies the detection signal input from the photodetector 124 and outputs the amplified detection signal as an amplification signal.

Returning to FIG. 1, the digitizing unit 13 converts the amplification signal input from the high frequency amplifier 125 to a waveform signal and outputs the waveform signal. The digitizing unit 13 is configured of, for example, a digitizer, an oscilloscope, or an FPGA. The waveform signal output by the digitizing unit 13 is input to the control apparatus 14.

The control apparatus 14 is an apparatus that controls the scanning unit 11 and the digitizing unit 13. The control apparatus 14 generates a waveform (an analysis image) on the basis of the waveform signal acquired from the digitizing unit 13 and inputs the analysis image to the input and output apparatus 15. The input and output apparatus includes an input apparatus such as a keyboard or a mouse for inputting a measurement condition or the like from the user, and a display apparatus such as a monitor for showing a measurement result or the like to the user. The input and output apparatus 15 displays the analysis image input from the control apparatus 14. It is possible to perform measurement of jitter, check of a switching image (waveform), or the like from the analysis image, and perform specifying of a failure location, or the like.

Next, acting effects of the inspection apparatus 1 according to the present embodiment will be described.

First, a configuration of an inspection apparatus according to a comparative example and problems in the configuration will be described. A light reflectance of an active device such as a transistor on a semiconductor device, such as an LSI, is about 10% or less and is not large. When such a semiconductor device is exposed to strong light, the device such as a transistor may be destroyed by incident light. Therefore, a light amount of light with which the semiconductor device is irradiated is reduced to such an extent that the semiconductor device is not destroyed. For example, when a solid immersion lens realizing a numerical aperture of 1 or more is used, an upper limit of the light amount of light with which the semiconductor device is irradiated is several mW, and an upper limit of reflected light (returned light) in this case is about 0.1 mW. For ideal measurement, shot noise of light may be made larger than thermal noise of a measurement instrument (more specifically, a photodetector or the like). In the inspection apparatus according to the comparative example (a general inspection apparatus), a photodetector (for example, a photodetector such as an APD) having a multiplication layer that amplifies returned light is adopted in order to make the shot noise larger than the thermal noise in a configuration in which the light amount of the returned light decreases as described above. With such a photodetector, it is possible to make the shot noise larger than the thermal noise and perform highly accurate inspection.

Here, in recent years, there has been a demand for an inspection apparatus capable of detecting a phenomenon in a wide band including a higher frequency band as the performance of semiconductor devices has improved. Specifically, for example, there is a demand for an inspection apparatus capable of accurately detecting minute jitter (for example, jitter of about 10 ps). In this regard, in the inspection apparatus having the photodetector according to the comparative example described above, since a capacity of the photodetector is relatively large, detection of a high speed signal (detection of a phenomenon in a high frequency band) cannot be performed. Specifically, the photodetector (for example, APD) according to the comparative example includes a multiplication layer between a P layer and an N layer, and a strong electric field is applied to the multiplication layer. The photodetector having the multiplication layer to which the strong electric field is applied has a relatively large capacity and cannot perform detection of a high speed signal (detection of a phenomenon in a high frequency band).

As a configuration for solving such a problem, the inspection apparatus 1 according to the embodiment includes the light source 121 that generates the light, the optical amplifier 123 that amplifies the input light and outputs the amplified light, the optical system (the objective lens 6, the imaging optical system 8, and the scanning optical system 9) that irradiates the semiconductor device D with the light from the light source 121 and guides the light from the semiconductor device D to the optical amplifier 123, the photodetector 124 that detects the light output from the optical amplifier 123, and the optical amplifier 123 amplifies the input light so that saturation does not occur.

In the inspection apparatus 1 according to the present embodiment, since the optical amplifier 123 is provided separately from the photodetector 124 and the light amplified by the optical amplifier 123 is detected by the photodetector 124, amplification of a signal for ensuring detection accuracy can be performed by the optical amplifier 123, and detection of the light after amplification can be performed by the photodetector 124. In such a configuration, since a photodetector having no multiplication layer and a relatively small capacity (for example, a PIN photodiode) can be used as the photodetector 124, it is possible to detect a phenomenon in a high frequency band (for example, a band of about 20 GHz that exceeds 10 GHz). Further, in the inspection apparatus 1 according to the present embodiment, the light is amplified by the optical amplifier 123 within a range in which saturation does not occur. When saturation occurs, there is concern that the minute signal included in the input light disappears after the amplification, and the minute signal is not appropriately detected. In this regard, it is possible to accurately detect even a minute phenomenon (such as jitter) on the basis of the output light including the minute signal by amplifying the light in a range in which saturation does not occur. As described above, with the inspection apparatus 1 according to the present embodiment, it is possible to accurately detect a phenomenon in a wide band including a high frequency band.

The optical amplifier 123 may amplify the input light so that a change in a light amount of light to be output with respect to a light amount of input light is linear. Thus, it is possible to accurately detect a phenomenon related to the returned light from the semiconductor device D because the input light and the output light are in a linear relationship.

The optical amplifier 123 may amplify the input light so that the light amount of light to be output is larger than half the maximum amount of light that can be output. Thus, it is possible to sufficiently increase the gain while avoiding saturation, and to ensure the detection accuracy of the phenomenon.

The optical amplifier 123 may amplify the input light so that the shot noise included in the light to be output exceeds the thermal noise of the photodetector 124. Thus, since the light is amplified so that noise included in the light is larger than the noise related to the photodetector 124, the noise included in the light (shot noise or relative intensity noise) becomes dominant, and the detection accuracy can be prevented from deteriorating due to an influence of the noise (thermal noise) related to the photodetector 124.

The optical amplifier 123 may include an amplification element having a length that satisfies a condition for amplifying input light so that saturation does not occur. This makes it possible to appropriately amplify the input light under a condition set so that the saturation does not occur.

The optical amplifier 123 may be a semiconductor amplifier, an optical fiber optical amplifier, or a tapered amplifier.

This makes it possible to appropriately amplify the light in the above-described range in which the saturation does not occur.

The photodetector 124 may be a PIN photodiode. Thus, it is possible to detect the phenomenon in the high frequency band by using the PIN photodiode having a relatively small capacity as the photodetector.

The photodetector 124 may be configured to be able to detect light in a band of 8 GHz or more. This makes it possible to detect a phenomenon in a high frequency band.

REFERENCE SIGNS LIST

1 Inspection apparatus
6 Objective lens (optical system)
8 Imaging optical system (optical system)
9 Scanning optical system (optical system)
121 Light source
123 Optical amplifier
124 Photodetector

The invention claimed is:

1. An inspection apparatus comprising:
   a light source configured to emit light;
   an optical amplifier configured to amplify input light and output the amplified light;
   an optical system configured to irradiate a semiconductor device with the light from the light source and guide light from the semiconductor device to the optical amplifier; and
   a photodetector configured to detect the light output from the optical amplifier, wherein
   the optical amplifier amplifies the input light so that saturation does not occur, and
   the optical amplifier amplifies the input light so that a change in a light amount of light to be output with respect to a light amount of the input light is linear.

2. The inspection apparatus according to claim 1, wherein the optical amplifier amplifies the input light so that a light amount of light to be output is larger than half the maximum amount of light that is able to be output.

3. The inspection apparatus according to claim 1, wherein the optical amplifier amplifies the input light so that shot noise included in light to be output exceeds thermal noise of the photodetector.

4. The inspection apparatus according to claim 1, wherein the optical amplifier includes an amplification element having a length satisfying a condition for amplifying the input light so that saturation does not occur.

5. The inspection apparatus according to claim 1, wherein the optical amplifier is a semiconductor amplifier, an optical fiber optical amplifier, or a tapered amplifier.

6. The inspection apparatus according to claim 1, wherein the photodetector is a PIN photodiode.

7. The inspection apparatus according to claim 1, wherein the photodetector is configured to be able to detect light in a band of 8 GHz or more.

* * * * *